US010622025B2

(12) United States Patent
Gopalakrishna et al.

(10) Patent No.: US 10,622,025 B2
(45) Date of Patent: Apr. 14, 2020

(54) CARRIERLESS STORAGE CHASSIS

(71) Applicant: Seagate Technology LLC, Cupertino, CA (US)

(72) Inventors: Shankar Gopalakrishna, Bangalore (IN); Saju Cheeran Verghese Francis, Bangalore (IN); Odie Killen, Colorado Springs, CO (US); Anil Koyad Choyikkunnil, Bangalore (IN)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 16/000,594

(22) Filed: Jun. 5, 2018

(65) Prior Publication Data

US 2019/0371366 A1    Dec. 5, 2019

(51) Int. Cl.
| | |
|---|---|
| *H05K 5/00* | (2006.01) |
| *G11B 33/12* | (2006.01) |
| *G06F 1/18* | (2006.01) |
| *H05K 5/02* | (2006.01) |
| *G11B 33/02* | (2006.01) |

(52) U.S. Cl.
CPC ............ *G11B 33/124* (2013.01); *G06F 1/181* (2013.01); *G06F 1/187* (2013.01); *G11B 33/022* (2013.01); *G11B 33/128* (2013.01); *H05K 5/0026* (2013.01); *H05K 5/0295* (2013.01)

(58) Field of Classification Search
None
See application file for complete search history.

(56) References Cited

U.S. PATENT DOCUMENTS

| | | | |
|---|---|---|---|
| 5,319,519 A | 6/1994 | Sheppard et al. | |
| 6,667,879 B2 | 12/2003 | Salinas et al. | |
| 8,331,095 B2 * | 12/2012 | Hu | H05K 7/1487 312/223.1 |
| 8,902,579 B1 | 12/2014 | Lalouette | |
| 9,629,275 B1 | 4/2017 | Beall | |
| 9,763,353 B1 | 9/2017 | Beall | |
| 9,763,362 B1 * | 9/2017 | Xu | H05K 7/1489 |
| 9,924,610 B2 * | 3/2018 | Chiasson | G11B 33/124 |
| 10,353,442 B2 * | 7/2019 | Searby | G06F 13/4068 |
| 2007/0007101 A1 * | 1/2007 | Richter | B65G 1/023 193/35 G |
| 2008/0112126 A1 | 5/2008 | Hsu | |
| 2011/0103001 A1 * | 5/2011 | Chen | G11B 33/128 361/679.39 |

(Continued)

*Primary Examiner* — Courtney L Smith
*Assistant Examiner* — Rashen E Morrison
(74) *Attorney, Agent, or Firm* — Mueting, Raasch & Gebhardt, P.A.

(57) ABSTRACT

A storage chassis may be adapted, or configured, to secure a plurality of carrierless devices (e.g., without the use of a carrier or drive tray) received thereby. The storage chassis may include a base, a first drive wall coupled to and extending from the base, and a second drive wall coupled to and extending from the base. The first drive wall may be spaced apart from the second drive wall. The base, the first drive wall, and the second drive wall may define a row of drive slots and each drive slot of the row of drive slots may be configured to receive a carrierless device. Further, the storage chassis may include a plate extending across the row of drive slots and may be configured to extend over the carrierless devices received by the row of drive slots.

19 Claims, 16 Drawing Sheets

(56) References Cited

U.S. PATENT DOCUMENTS

| | | | |
|---|---|---|---|
| 2011/0173805 A1 | 7/2011 | Richet et al. | |
| 2011/0194242 A1* | 8/2011 | Hu | G06F 1/187 |
| | | | 361/679.32 |
| 2011/0299237 A1 | 12/2011 | Liang | |
| 2012/0113583 A1 | 5/2012 | Peng et al. | |
| 2013/0129766 A1 | 9/2013 | Williams et al. | |
| 2014/0085804 A1* | 3/2014 | Song | G06F 1/183 |
| | | | 361/679.33 |
| 2014/0152164 A1 | 6/2014 | Tu | |
| 2015/0070829 A1* | 3/2015 | Ning | H05K 7/20727 |
| | | | 361/679.33 |
| 2016/0353600 A1* | 12/2016 | Bennett, II | G11B 3/124 |
| 2019/0012288 A1* | 1/2019 | Zhao | G06F 13/4081 |

\* cited by examiner

CARRIERLESS STORAGE CHASSIS

The disclosure herein relates to a storage server chassis that receives data storage devices without carriers, and further to systems and components for providing such data storage device adaption.

SUMMARY

An illustrative apparatus may include a base, a first drive wall, a second drive wall, and a plate. The first drive wall may be coupled to and extending from the base. The second drive wall may be coupled to and extending from the base. The first drive wall may be spaced apart from the second drive wall. The base, the first drive wall, and the second drive wall may define a row of drive slots and each drive slot of the row of drive slots may be configured to receive a carrierless data storage device. The plate may extend across the row of drive slots and may be configured to extend over the carrierless data storage devices received by the row of drive slots.

An illustrative system may include a storage chassis and a carrierless data storage device. The storage chassis may include a base, a first drive wall, a second drive wall, and a plate. The base may include a plurality of board connectors. The first drive wall may be coupled to and extending from the base and the second drive wall may be coupled to and extending from the base. The first drive wall may be spaced apart from the second drive wall. The base, the first drive wall, and the second drive wall may define a row of drive slots. The plate may be removably coupled to the base and may extend across the row of drive slots. The carrierless data storage device may be positioned within a drive slot of the row of drive slots and may be operably coupled to a board connector of the plurality of board connectors. The carrierless data storage device may be restricted from movement by the first drive wall and the second drive wall.

An illustrative method may include positioning a data storage device proximate an opening of a drive slot of a row of drive slots defined by a base, a first drive wall, and a second drive wall spaced apart from the first drive wall. The method may further include inserting the data storage device into the drive slot and directly engaging the data storage device with alignment features of the first and second drive walls and a board connector of the base. Also, the method may include securing a plate across the row of drive slots to restrict movement of the data storage device within the drive slot.

An illustrative storage chassis may include a base, a first drive wall, a second drive wall, a plate, and a plurality of ejectors. The base may include a bottom portion extending between a first end and a second end. The base may further include a first sidewall portion extending from the first end of the bottom portion and a second sidewall portion extending from the second end of the bottom portion. The first drive wall may be coupled to the bottom portion of the base and may extend between a first end and a second end. The first end of the first drive wall may be coupled to the first sidewall portion and the second end of the first drive wall may be coupled to the second sidewall portion. The second drive wall may be coupled to the bottom portion of the base and may extend between a first end and a second end. The first end of the second drive wall may be coupled to the first sidewall portion and the second end of the second drive wall may be coupled to the second sidewall portion. The second drive wall may be spaced apart from and extending parallel to the first drive wall. A row of drive slots may be defined by the base, the first drive wall, and the second drive wall. Each drive slot of the row of drive slots may be configured to receive a data storage device. The plate may be removably coupled to the first and second sidewall portions of the base and may extend across the row of drive slots between a first end and a second end. The plurality of ejectors may be proximate one of the first and second drive walls. Each ejector of the plurality of ejectors may be associated with a drive slot of the row of drive slots and may be actuatable to move the data storage device received by the drive slot away from the bottom portion of the base.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Figure 1:
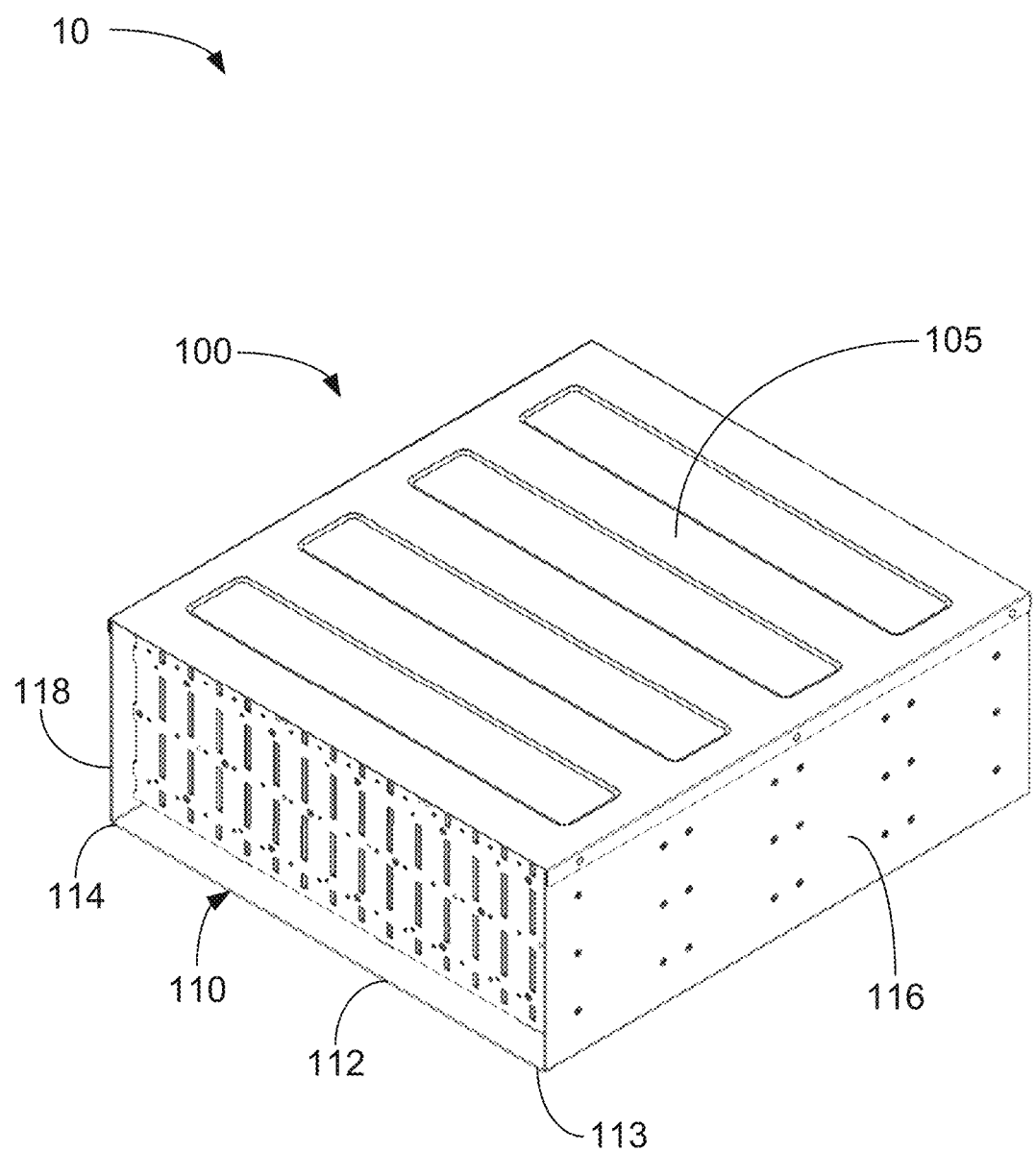
FIG. 1 is a perspective view of a system including a storage chassis enclosed.

Exemplary systems, apparatus, and storage chassis shall be described with reference to FIGS. 1-10. It will be apparent to one skilled in the art that elements or processes from one embodiment may be used in combination with elements or processes of the other embodiments, and that the possible embodiments of such systems, apparatus, and storage chassis using combinations of features set forth herein is not limited to the specific embodiments shown in the figures and/or described herein. Further, it will be recognized that the size and shape of various elements herein may be modified but still fall within the scope of the present disclosure, although certain one or more shapes and/or sizes, or types of elements, may be advantageous over others.

The present disclosure relates to storage server chassis that are configured to directly interface with devices received thereby. In one or more embodiments, the devices are data storage drives, which may include any device and/or apparatus configured to store data (e.g., binary data, etc.). The data storage drives may include one or more storage mediums that may include, but are not necessarily limited to, solid state memory, hard magnetic discs, magnetic tapes, optical discs, integrated circuits, volatile memory, non-volatile memory, and any combination thereof. In one or more embodiments, the devices may be computing devices such as, e.g., file servers, storage servers, NAS servers, cold storage, workstations, etc. Generally, storage server chassis require each data storage device installed in the chassis to include a carrier (e.g., drive tray) to act as an intermediary between the chassis and data storage device. In other words, each data storage device may be first installed into a separate drive tray and then installed into the chassis as a removable drive unit.

However, in high density systems (e.g., systems with over 60 to 80 drives), having a separate drive tray that is associated with each data storage device may add unnecessary components to the system and may be more costly to maintain. For example, both the data storage device and the corresponding drive tray may need to be maintained and stored (e.g., when a data storage device and/or drive tray needs to be replaced). Further, for example, a data center may have multiple types of chassis/systems that require multiple different types of data storage devices and drive tray combinations or separate packaging may be necessary to pack and ship data storage device and drive tray combinations.

By creating a storage chassis that directly interacts and interfaces with the data storage devices (e.g., as described herein) and removing the need for a drive tray, the storage chassis may be simplified through a reduction in separate components and cost. For example, the carrierless data storage device (e.g., a data storage device without a drive tray) becomes the field replaceable unit (FRU) itself such that it is not required to maintain both the data storage device and the drive tray. Furthermore, the carrierless data storage device may be configured such that the data storage device may be installed into the storage chassis and removed from the storage chassis without the use of additional tools such as, e.g., screws, screwdrivers, and the equivalent thereof (e.g., making the data storage device installation and removal completely toolless).

Specifically, the storage chassis described herein may include features that accommodate and directly interface with the data storage device to retain or secure the data storage device within the storage chassis. Further, for example, features of the storage chassis may help provide dampening of vibrations and shock transfers to the data storage devices. Also, the storage chassis may include features that assist in removing data storage devices received by the storage chassis. As a result, the storage chassis as described herein may, e.g., eliminate the cost and space needed for storing drive trays, eliminate the cost and time to assemble data storage devices into drive trays, eliminate unique packaging for data storage devices and drive trays (i.e., only need data storage device packaging), allow for the direct shipment of a data storage device to a customer without any additional processing or components (e.g., drive trays), etc.

Exemplary storage chassis, as described herein, may include multiple drive walls spaced apart from one another such that two drive walls and a base of the storage chassis define a row of drive slots that are configured to receive a plurality of data storage devices. For example, drive walls may define segmented slots that may be arranged in a row and each drive slot may be configured to independently receive a data storage device. Specifically, each drive slot may define an opening to receive the data storage device. Therefore, the data storage devices may be organized in the storage chassis (e.g., in rows).

The drive walls may include features that assist in defining the row of drive slots in which the data storage devices are received. Further, the drive walls may include features that assist in retaining the data storage devices within the slots (e.g., to restrict movement, to dampen vibrations, etc.). For example, in one or more embodiments, the storage chassis may include a plate that is removably couplable to a portion of the storage chassis and extends over the openings along the row of drive slots when coupled thereto. The plate may be positioned over the openings of the drive slots after the data storage devices are inserted therein and the plate may extend over the opening to prevent the data storage devices from being removed from the drive slots (and, e.g., restrict movement of the devices).

Furthermore, the storage chassis may include an ejector configured to assist in removing an individual data storage device from the corresponding drive slot when the plate is not restricting movement of the data storage device through the opening of the drive slot. For example, the ejector may be located within or proximate one of the drive walls and be actuatable by a user to remove the data storage device. As a result, each data storage device may be easily and independently removable from the corresponding drive slot as desired via the ejector.

The following terms used throughout the present disclosure are defined as follows, unless the context of the disclosure dictates otherwise:

As used herein, "mount" means to attach to a structure for operational use. For example, a device may be mounted to an enclosure by attaching the device to a receiving frame of the enclosure and optionally connecting the device to a circuit board of the enclosure such that the device is installed in the enclosure.

As used herein, "secure" means to restrict the movement of a component relative to another component suitably for a particular application. For example, a device may be secured within the storage chassis between the drive walls, a bottom portion of the base, and a plate to restrict movement of the device relative to the storage chassis.

As used herein, "engage" means to interface, touch, or directly contact to accomplish a particular task. For example, a user may engage the ejector to actuate the ejector such that the device may be easily removed.

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference will now be made to the drawings, which depict one or more aspects described in this disclosure. However, it will be understood that other aspects not depicted in the drawings fall within the scope and spirit of this disclosure. Like numbers used in the figures refer to like components, elements, portions, regions, openings, apertures, and the like. However, it will be understood that the use of a reference character to refer to an element in a given figure is not intended to limit the element in another figure labeled with the same reference character.

FIG. 1 shows an enclosure system 10 according to one or more embodiments. As illustrated, the enclosure system 10 may include a storage chassis 100. The storage chassis 100 may include a base 110 having a bottom portion 112 and opposing sidewall portions extending from opposing ends of the bottom portion 112. For example, the bottom portion 112 may extend between a first end 113 and a second end 114, and the opposing sidewall portions may include a first sidewall portion 116 extending from the first end 113 of the bottom portion 112 and a second sidewall portion 118 extending from the second end 114 of the bottom portion 112. The storage chassis 100 may be further divided into rows extending between the first sidewall portion 116 and the second sidewall portion 118 to receive data storage devices (e.g., as will be further described with respect to FIG. 2). Further, in one or more embodiments, the storage chassis 100 may include a top cover 105 that is removably couplable to the base 110 and extending over the base 110 between the first and second sidewall portions 116, 118. The top cover 105 may be placed on the base 110 to protect or shield the data storage devices contained therein.

Figure 2:
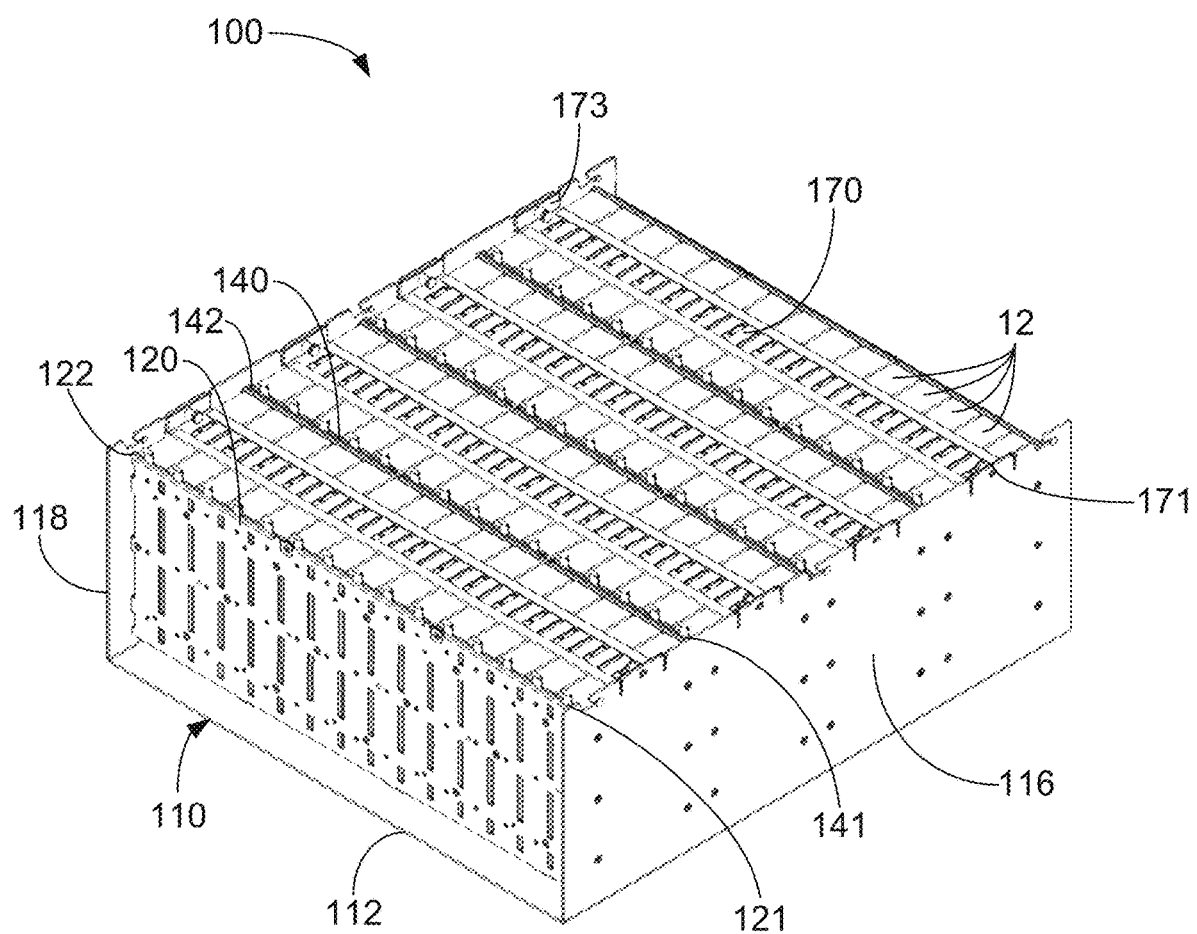
FIG. 2 is a perspective view of the storage chassis of FIG. 1 illustrating a plurality of rows of data storage devices contained by the storage chassis.

The storage chassis 100 with the top cover 105 removed is illustrated in FIG. 2. The storage chassis 100 may include a first drive wall 120 coupled to and extending from the base 110. For example, the first drive wall 120 may extend between a first end 121 and a second end 122. The first end 121 of the first drive wall 120 may be coupled to the first sidewall portion 116 and the second end 122 of the first drive wall 120 may be coupled to the second sidewall portion 118. Further, the storage chassis 100 may include a second drive wall 140 coupled to and extending from the base 110. For example, the second drive wall 140 may extend between a first end 141 and a second end 142. The first end 141 of the second drive wall 140 may be coupled to the first sidewall portion 116 and the second end 142 of the second drive wall 140 may be coupled the second sidewall portion 118.

Figure 3:
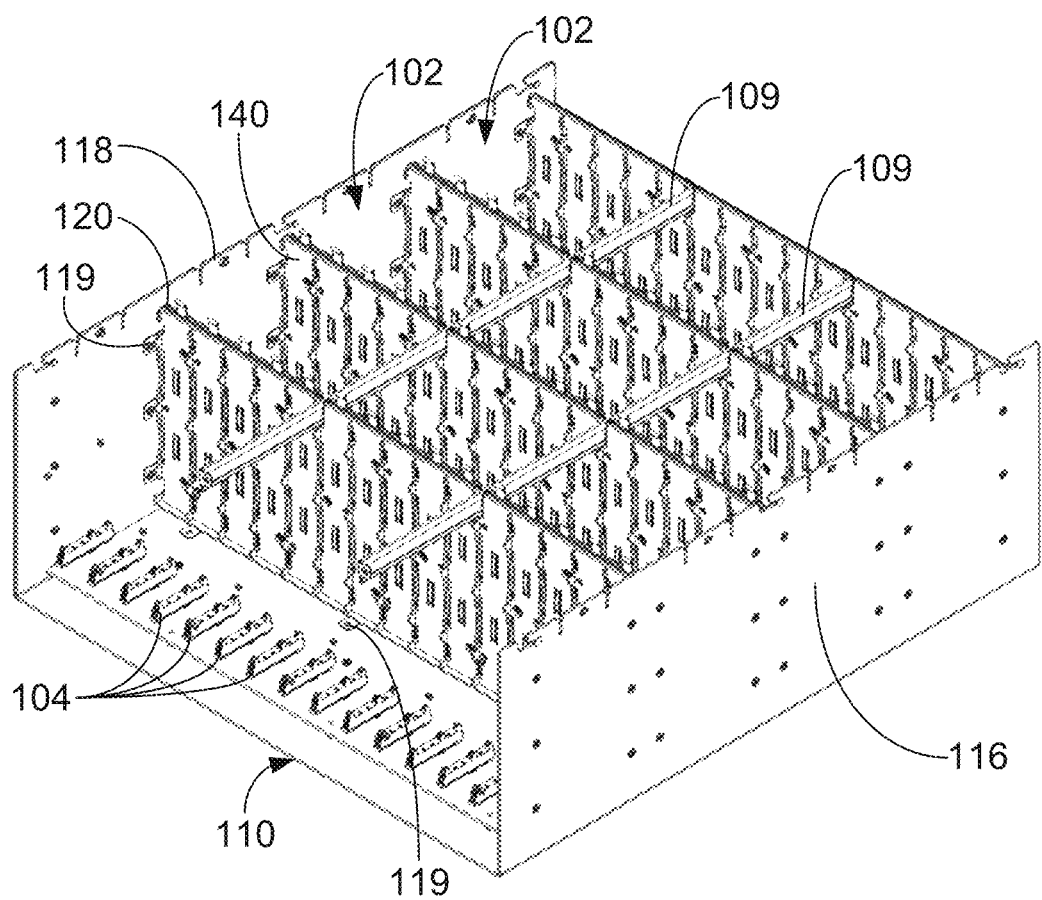
FIG. 3 is a perspective view of the storage chassis of FIG. 2 without the data storage devices.
Figure 4:
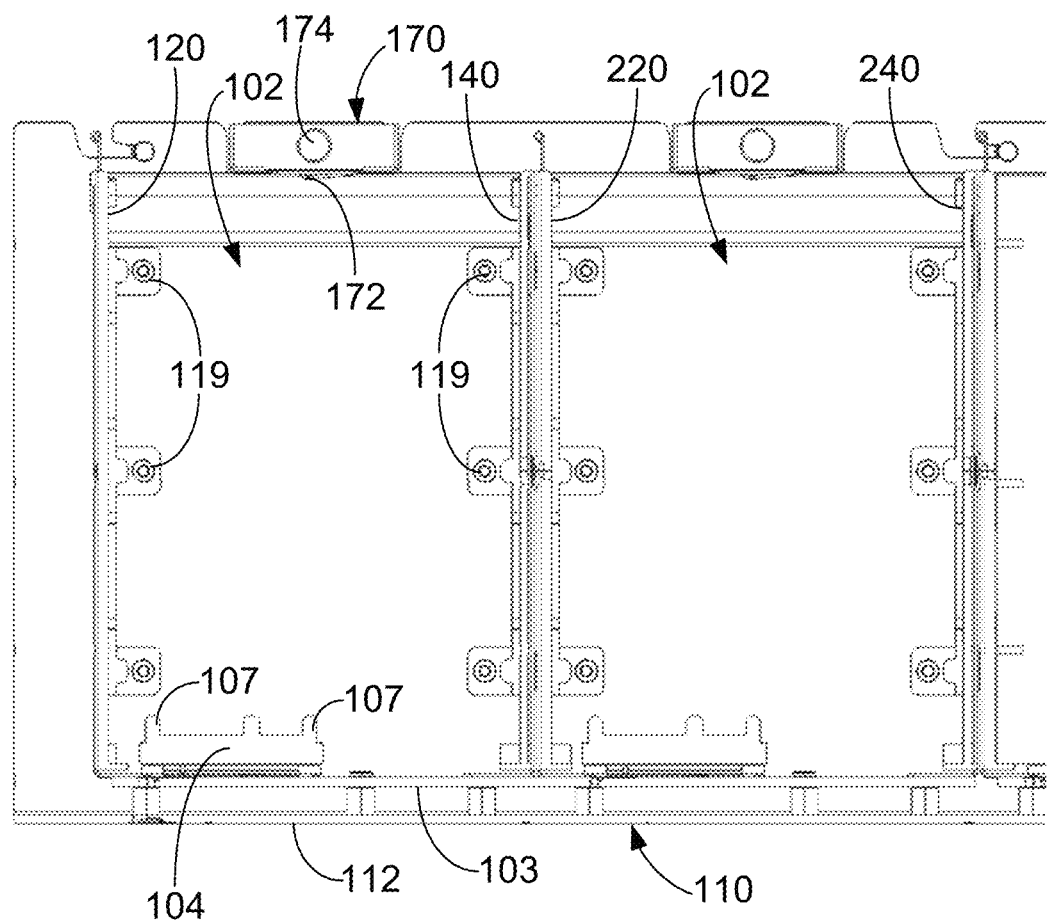
FIG. 4 is a cross-sectional view illustrating a drive slot of the storage chassis of FIG. 2 that receives a data storage device.

The first and second drive walls 120, 140 may be coupled to each of the base 110, the first sidewall portion 116, and the second sidewall portion 118 in any suitable way. For example, the first and second drive walls 120, 140 may be coupled to each of the base 110 (e.g., the bottom portion 112 of the base 110), the first sidewall portion 116, and the second sidewall portion 118 by fasteners, rivets, welding, swaging, flaring, adhesive, etc. As shown in FIGS. 3 and 4, the first and second drive walls 120, 140 may include tabs 119 that are positioned to easily couple the first and second drive walls 120, 140 to each of the base 110, the first sidewall portion 116, and the second sidewall portion 118.

The first drive wall 120 may be spaced apart from the second drive wall 140. For example, the first drive wall 120 may extend parallel to and a distance away from the second drive wall 140 such that the space between the first and second drive walls 120, 140 (which may be sized to receive a data storage device 12) is evenly spaced for the length of each of the first and second drive walls 120, 140 (e.g., between the first sidewall portion 116 and the second sidewall portion 118). In one more embodiments, the storage chassis 100 may include support structures 109 (e.g., as shown in FIG. 3) extending across each of the first and second drive walls 120, 140 (e.g., in a direction perpendicular to the first and second drive walls 120, 140). The support structures 109 may assist in maintaining an equal distance between the first and second drive walls 120, 140 for the entire distance between the first and second sidewall portions 116, 118.

The base 110, the first drive wall 120, and the second drive wall 140 may define a row of drive slots 102 (e.g., as shown in FIG. 3). Each drive slot 102 of the row of drive slots 102 may be configured to receive a data storage device 12 as illustrated in FIG. 2. In other words, the base 110, the first drive wall 120, and the second drive wall 140 may form independent slots (e.g., through features of the base 110, the first drive wall 120, and the second drive wall 140) that define an opening and are configured to receive a data storage device 12 therein. Each data storage device 12 may then be operably mounted within the storage chassis 100 (e.g., operably coupled to a board connector 104 of a plurality of board connectors 104 as shown in FIG. 3). The base 110, the first drive wall 120, and the second drive wall 140 may be sized or configured to receive any form factor or size of data storage devices 12. For example, the data storage devices 12 may be a small form factor (e.g., 2.5-inch data storage devices) or large form factor (e.g., 3.5-inch data storage devices) and may define different mounting hole locations, connector locations, device height, interface connections, etc. However, it may be necessary that each of the data storage devices 12 are the same form factor or size to properly fit within each row of drive slots 102 (e.g., to directly interface with the first and second drive walls 120, 140).

The data storage devices 12 may directly interface or contact the first and second drive walls 120, 140. As such, the data storage devices 12 may be inserted into the storage chassis 100 without the use of a carrier or disk tray. Specifically, there may no components (e.g., that are removably couplable to the data storage device 12) between the data storage device 12 and the first and second drive walls 120, 140 to assist in making a connection therebetween. Therefore, the data storage devices 12 may be described as carrierless data storage devices 12.

Figure 8A:
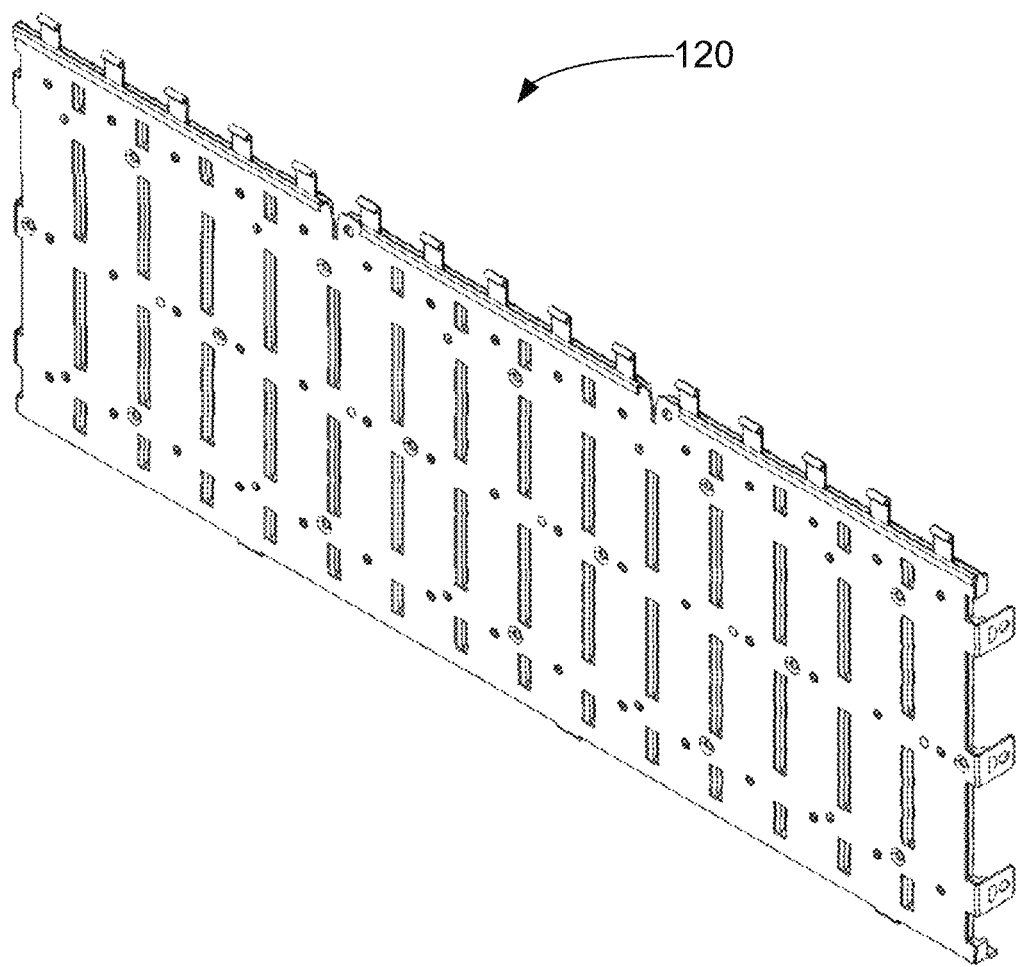
FIG. 8A is a perspective view of a first drive wall of the storage chassis of FIG. 2.
Figure 8B:
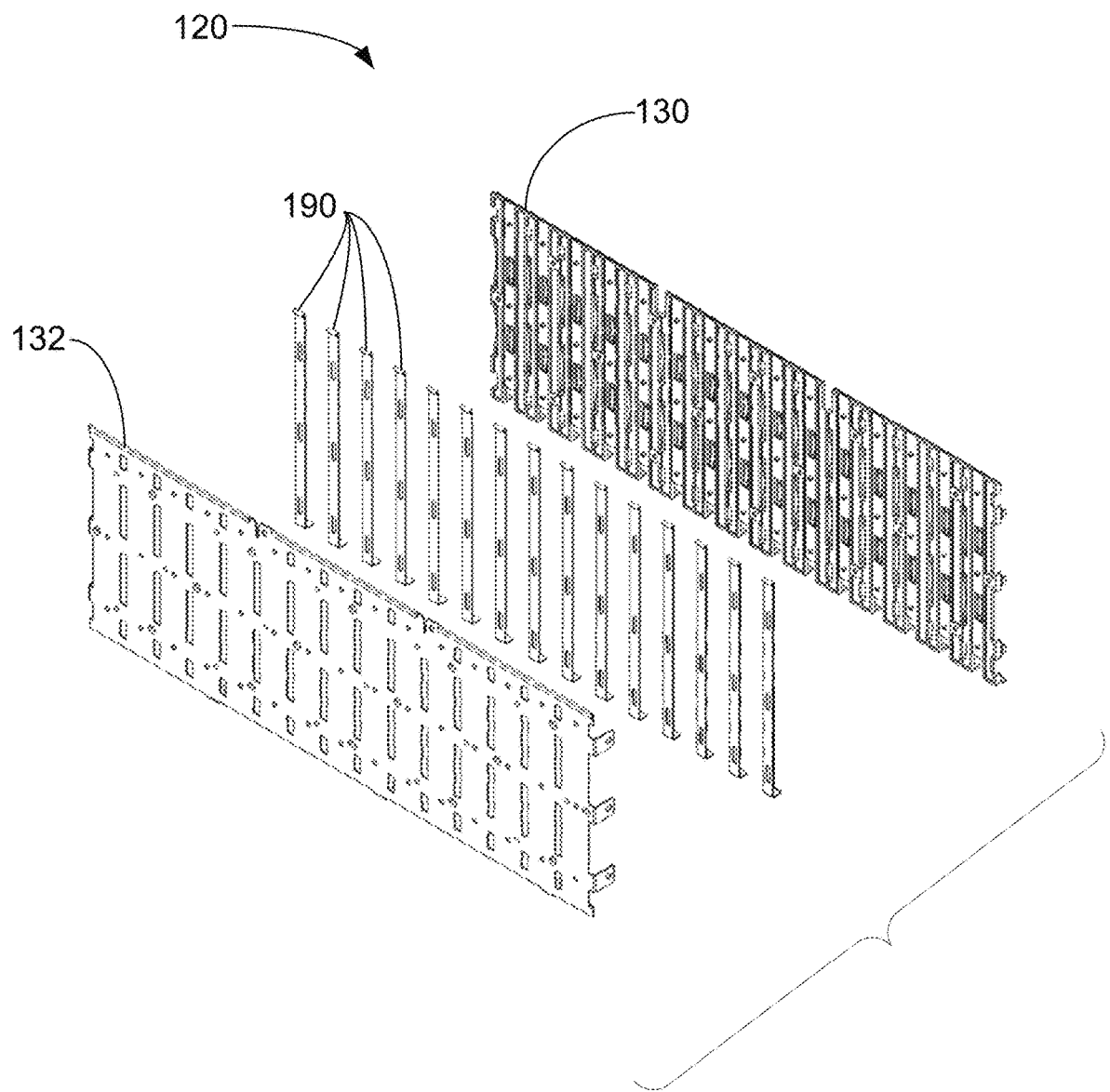
FIG. 8B is an exploded view of the first drive wall of FIG. 8A.
Figure 9A:
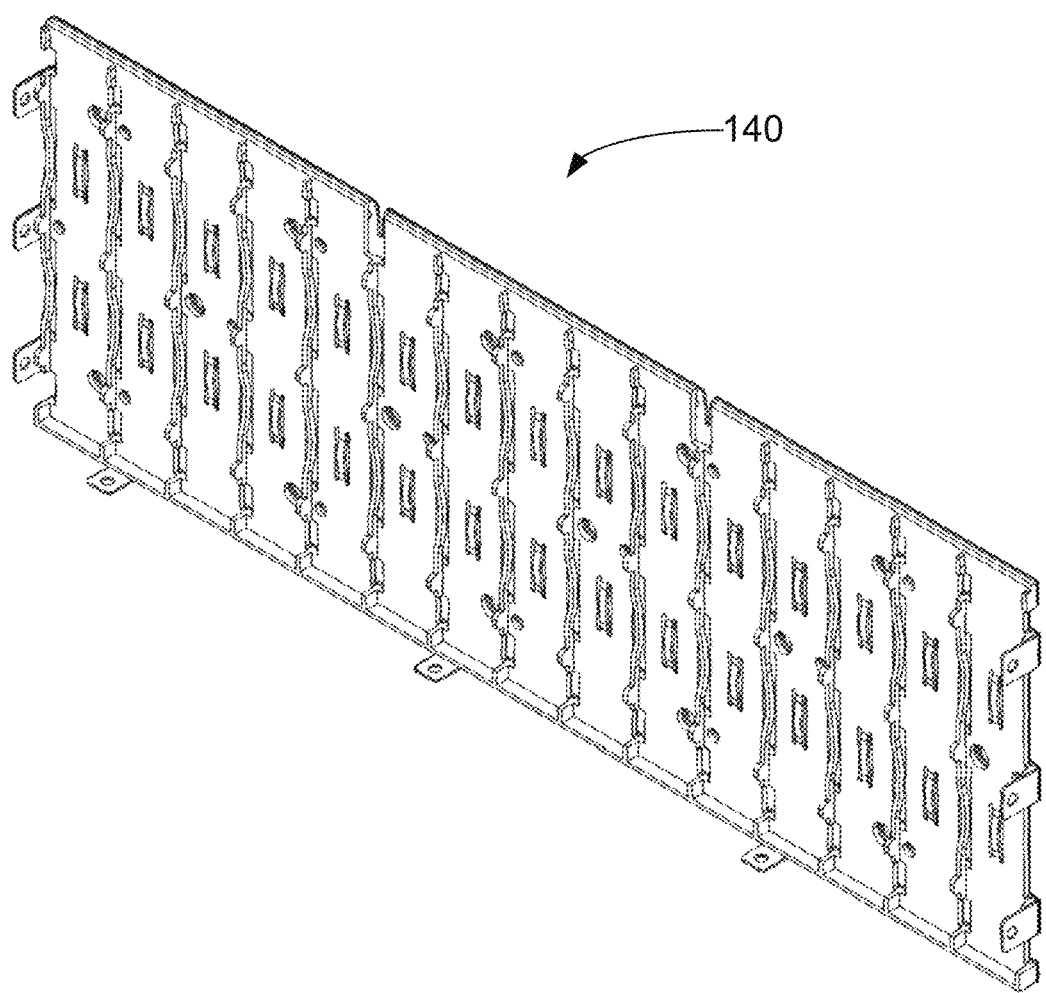
FIG. 9A is a perspective view of a second drive wall of the storage chassis of FIG. 2.
Figure 9B:
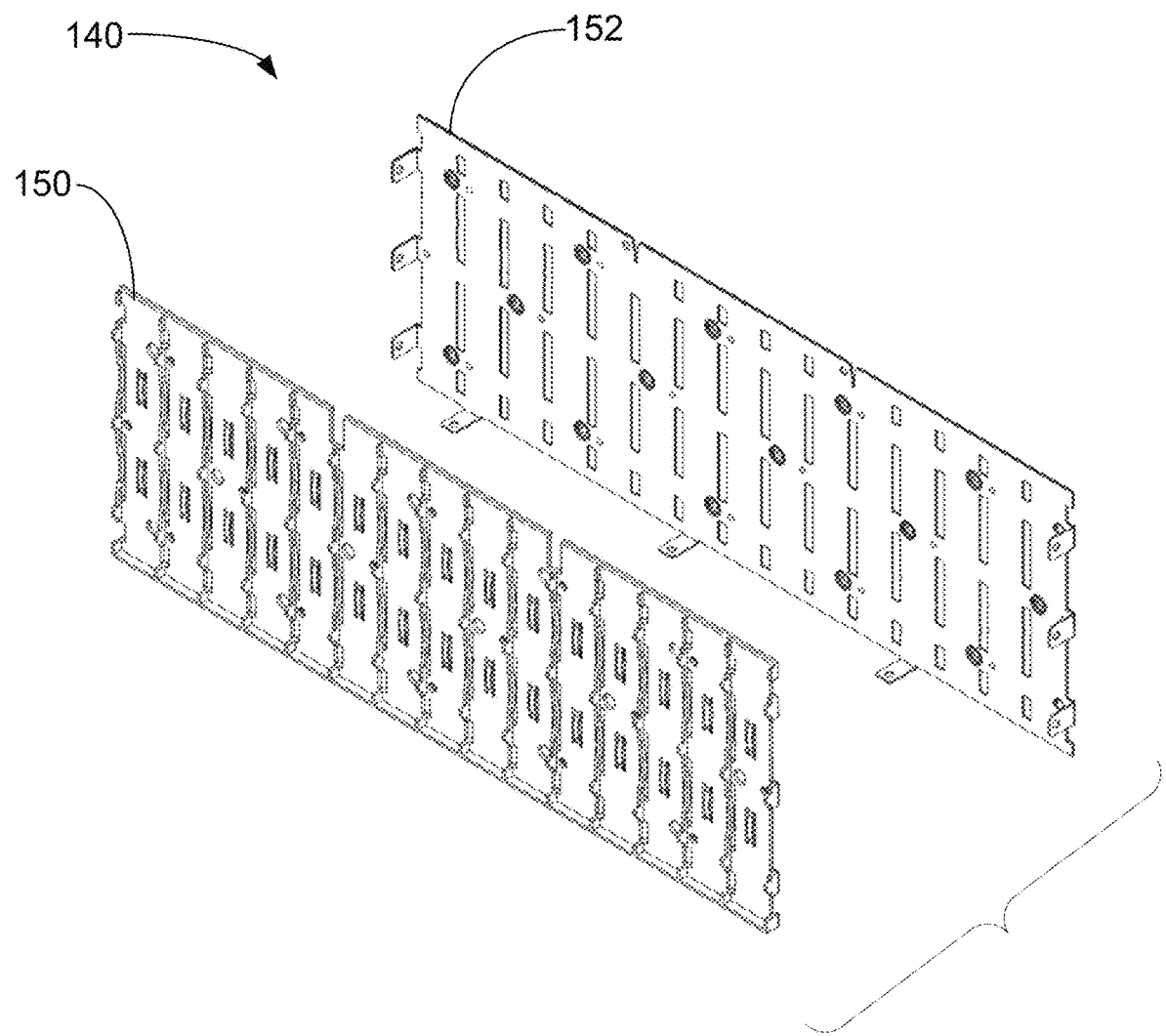
FIG. 9B is an exploded view of the second drive wall of FIG. 9A.

Specifically, in one or more embodiments, each of first and second drive walls 120, 140 may include multiple components that form the first and second drive walls 120, 140, respectively. For example, as shown in FIGS. 8A and 8B, the first drive wall 120 may include an interface portion 130 and an outer portion 132. The interface portion 130 of the first drive wall 120 may directly interface with the data storage device 12 (e.g., when the data storage device 12 is received by the drive slot 102). Similarly, for example, the second drive wall 140 may include an interface portion 150 and an outer portion 152, as shown in FIGS. 9A and 9B. The interface portion 150 of the second drive wall 140 may directly interface with the data storage device 12 (e.g., when the data storage device 12 is received by the drive slot 102).

The interface portions 130, 150 of each of the first and second drive walls 120, 140 may include features or components to directly interface with the data storage device 12. The interface portions 130, 150 and the outer portions 132, 152 may be made of any suitable material. For example, the interface portions 130, 150 may include plastic, metal, etc. and the outer portions 132, 152 may include metal, plastic, etc. The interface portions 130, 150 and the outer portions 132, 152 may be coupled to one another in any suitable way. For example, the interface portions 130, 150 and the corresponding outer portions 132, 152 may be coupled together by rivets, fasteners, swaging, flaring, adhesive, etc. In one or more embodiments, the first and second drive walls 120, 140 (e.g., the interface portions 130, 150 and the outer portions 132, 152) may define vent openings to provide air circulation to the data storage devices 12 received by the drive slots 102. In one or more embodiments, the outer portion 132 of the first drive wall 120 may be identical to the outer portion 152 of the second drive wall 140.

In one or more embodiments, the first drive wall 120 and the second drive wall 140 may be coupled to one another when dividing multiple rows of drive slots 102 (e.g., the second drive wall 140 and an additional first drive wall 220 as shown in FIG. 4). Specifically, the outer portion 132 of the first drive wall 120 may be coupled to the outer portion 152 of the second drive wall 140 such that the interface portions 130, 150 face towards the different rows of drive slots 102. In some embodiments, only one common "outer" portion may exist between the interface portion 130 of the first drive wall 120 and the interface portion 150 of the second drive wall 140.

Additionally, the storage chassis 100 may include a plate 170 (e.g., a locking plate, bracket, etc.) extending across the row of drive slots 102 and may be configured to extend over the data storage devices 12 received by the row of drive slots 102. In other words, the plate 170 may cover the opening formed by the first and second drive walls 120, 140 to restrict movement of the data storage devices 12 (e.g., to secure the data storage devices 12) received by the drive slots 102. The plate 170 may be removably couplable to the base 110. For example, the plate may be removably couplable to the first and second sidewall portions 116, 118 of the base 110. Specifically, the plate 170 may extend between a first end 171 and a second end 173 such that the first end 171 of the plate 170 may be removably couplable to the first sidewall portion 116 and the second end 173 of the plate 170 may be removably couplable to the second sidewall portion 118. In one or more embodiments, the top cover 105 may cover or protect the plate 170 (e.g., as shown in FIG. 1).

The plate 170 may be removably couplable to the base 110 such that the plate 170 may be easily removable to provide access to the data storage devices 12. For example, the plate 170 may be toolless or not require additional tools to couple the plate 170 to or remove the plate 170 from the base 110. The plate 170 may be configured to contain or secure (e.g., restrict movement of) all of the data storage devices 12 received by a single row of drive slots 102. In other words, to remove one individual data storage device 12, the plate 170 may need to be removed, providing access to all of the data storage devices 12 in that row.

FIG. 4 illustrates a cross-sectional view of storage chassis 100 showing a drive slot 102 without a data storage device 12 received therein. As shown, the storage chassis 100 includes a printed circuit board 103 defining the bottom of the drive slot 102. The printed circuit board 103 may be coupled to and spaced away from the bottom portion 112 of the base 110. In one or more embodiments, the first and second drive walls 120, 140 may be coupled to the printed circuit board 103. The board connector 104 may be coupled to the printed circuit board 103 and positioned to be operably connected to the data storage device 12 when the data storage device 12 is inserted into the drive slot 102. In other words, the data storage device 12 may be operably connected or mounted to the printed circuit board 103 through the connector 104 (e.g., to transmit information and/or power). In one or more embodiments, the connector 104 may include one or more stop components 107 to control the depth at which the data storage device 12 engages the connector 104. Further, the first and second drive walls 120, 140 may extend from the printed circuit board 103 and define sidewalls of the drive slot 102.

In one or more embodiments, the storage chassis 100 may define multiple rows of drive slots 102 (e.g., as shown in FIG. 3) and, therefore, multiple first and second drive walls 120, 140 may be implemented to define those multiple rows of drive slots 102. As described above, each of the first and second drive walls 120, 140 may be coupled to and extending from the base 110. Therefore, as shown in FIG. 4, an additional first drive wall 220 may be coupled to the base 110 and positioned to coextend along the second drive wall 140. A corresponding additional second drive wall 240 may be spaced apart from the additional first drive wall 220 similar to as described with regards to the first and second drive walls 120, 140. Therefore, the additional first drive wall 220 may be positioned between the second drive wall 140 and the additional second drive wall 240. The additional first and second drive walls 220, 240 may be identical to and include the same features as described with regards to the first and second drive walls 120, 140 (e.g., may at least partially define an additional row of drive slots 102 that are configured to receive data storage devices 12, may correspond to an additional plate 170 to cover the openings defined by the drive slots 102, etc.).

As shown in FIG. 4, the plate 170 provides a barrier to the open end of the drive slot 102 defined by the first and second drive walls 120, 140 (e.g., opposite the printed circuit board 103). Therefore, in one or more embodiments, the first drive wall 120, second drive wall 140, and the plate 170 may restrict movement of or secure the data storage device 12 located within the drive slot 102. For example, each of the first drive wall 120, second drive wall 140, and the plate 170 may directly contact the data storage device 12 to restrict movement of or secure the data storage device 12.

Figure 7:
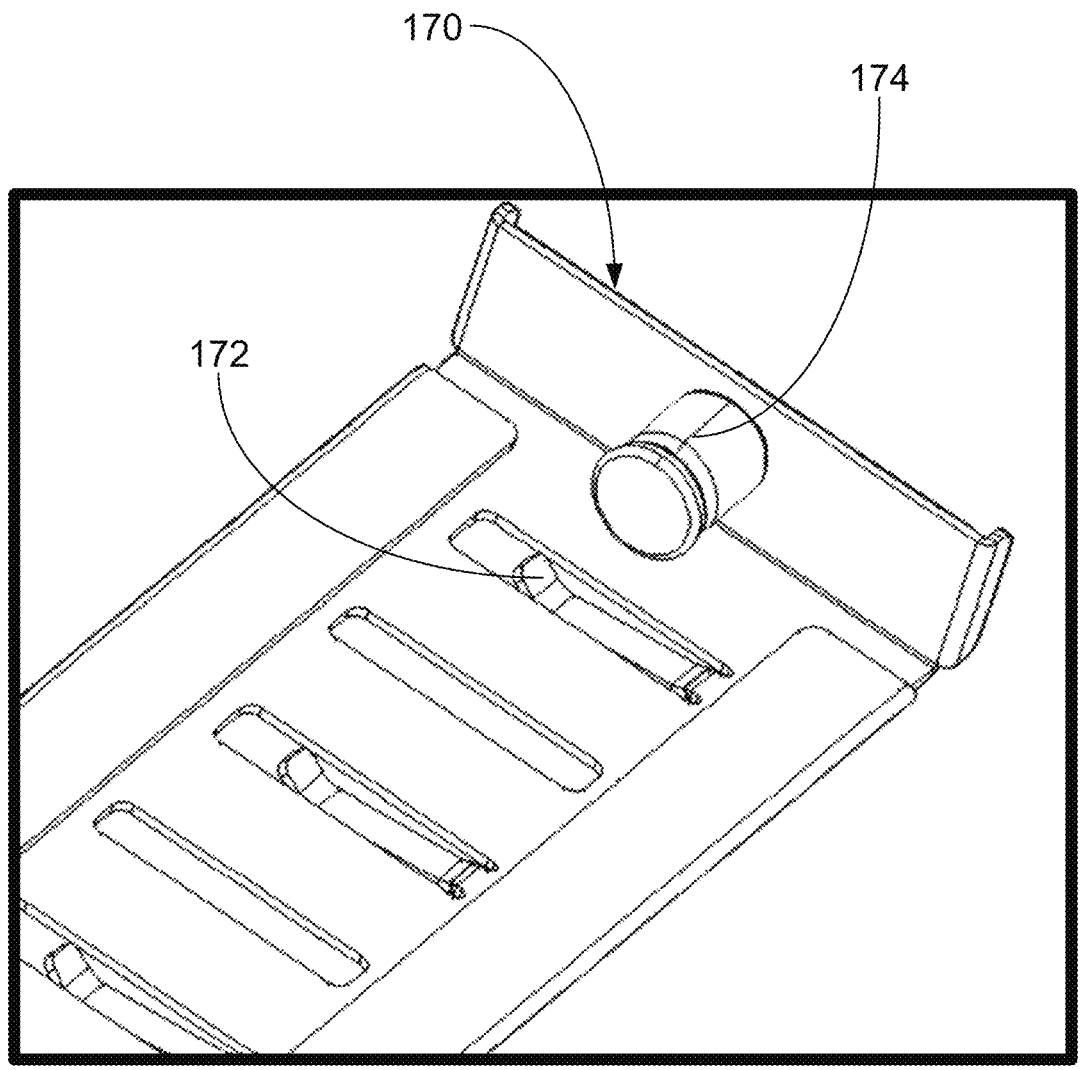
FIG. 7 is a perspective view of a plate configured to constrain data storage devices in a storage chassis.

In one or more embodiments, the plate 170 may include a latching member 174 to removably couple or lock the plate 170 and the base 110 as shown in FIGS. 4 and 7. In one or more embodiments, the plate 170 may include a latching member 174 on each side of the plate 170 (e.g., on the first and second ends 171, 173 of the plate 170) to, e.g., removably couple the plate 170 to each of the first and second sidewall portions 116, 118. The latching member 174 may removably couple the plate 170 to the base 110 so that the plate 170 may be easily attached to and removed from the base 110 to, e.g., provide easy access to the data storage devices 12 located within the drive slots 102. The latching member 174 may include any suitable components for removably coupling the plate 170 and the base 110. For example, the latching member 174 may include a fastener, a quick-connect coupler, a push pin, etc.

The plate 170 may also include a biasing member 172 (e.g., a leaf spring) as shown in FIGS. 4 and 7. The biasing member 172 may be configured to apply a force against the data storage device 12 when the plate 170 is coupled to the base 110 and the data storage device 12 is received by the drive slot 102. The biasing member 172 may be defined by a portion of the plate 170 (e.g., defined by slits in the plate 170) and configured to deflect such that a constant force is applied against the data storage device 12 when received by the drive slot 102 and the plate 170 is positioned against the data storage device 12. The biasing member 172 of the plate 170 may be configured to apply a force against the data storage device 12 such that the data storage device 12 is forced towards the printed circuit board 103 to, e.g., ensure a stable connection between the data storage device 12 and the connector 104. Further, the biasing member 172 of the plate 170 may assist in dampening or minimizing vibrations/shocks and movement of the data storage device 12 within the drive slot 102. In one or more embodiments, the biasing member 172 may assist in accommodating size tolerance variations of the data storage device 12.

Figure 5A:
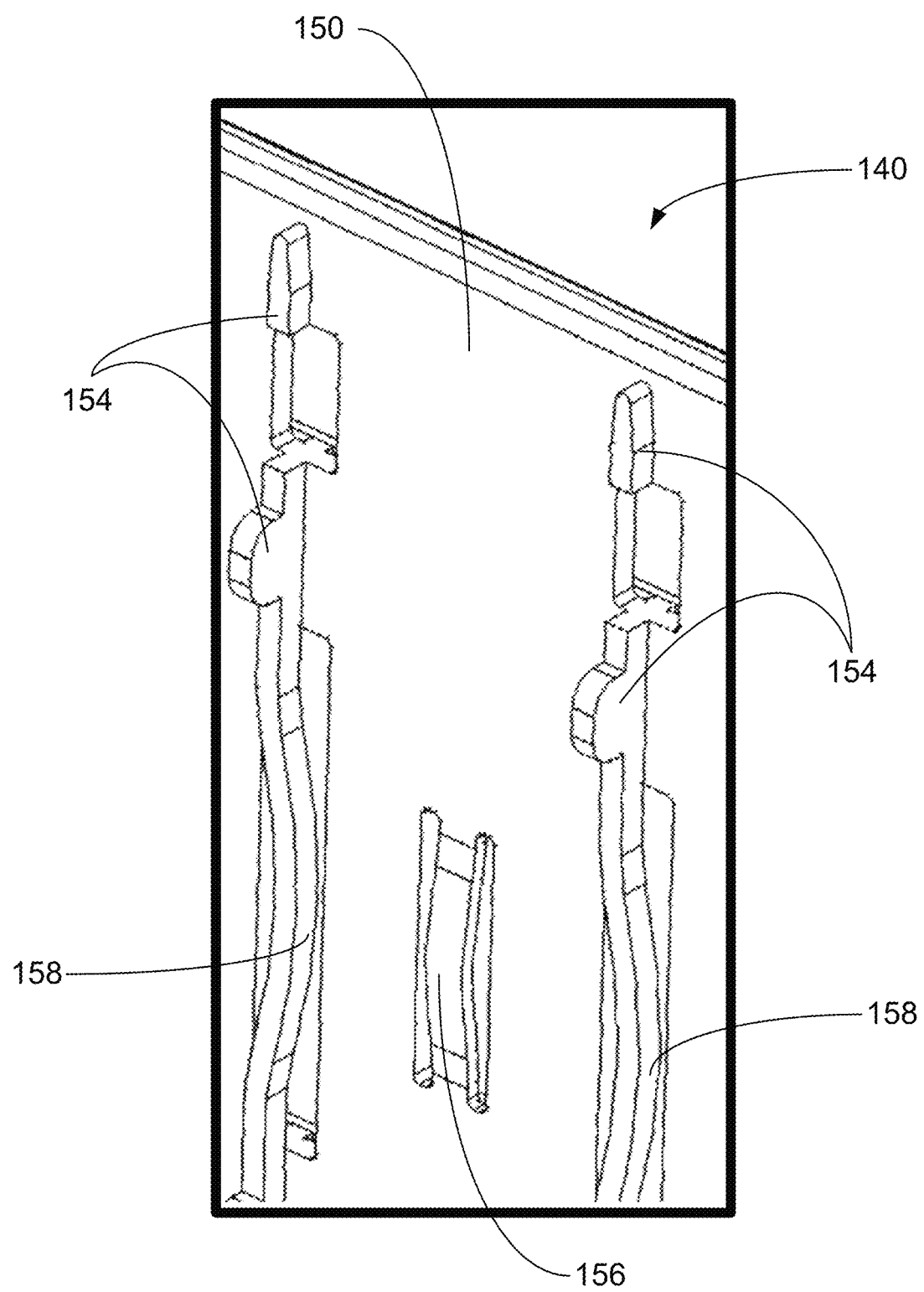
FIGS. 5A and 5B are expanded views of a drive wall of an illustrative storage chassis illustrating components of the drive wall.
Figure 5B:
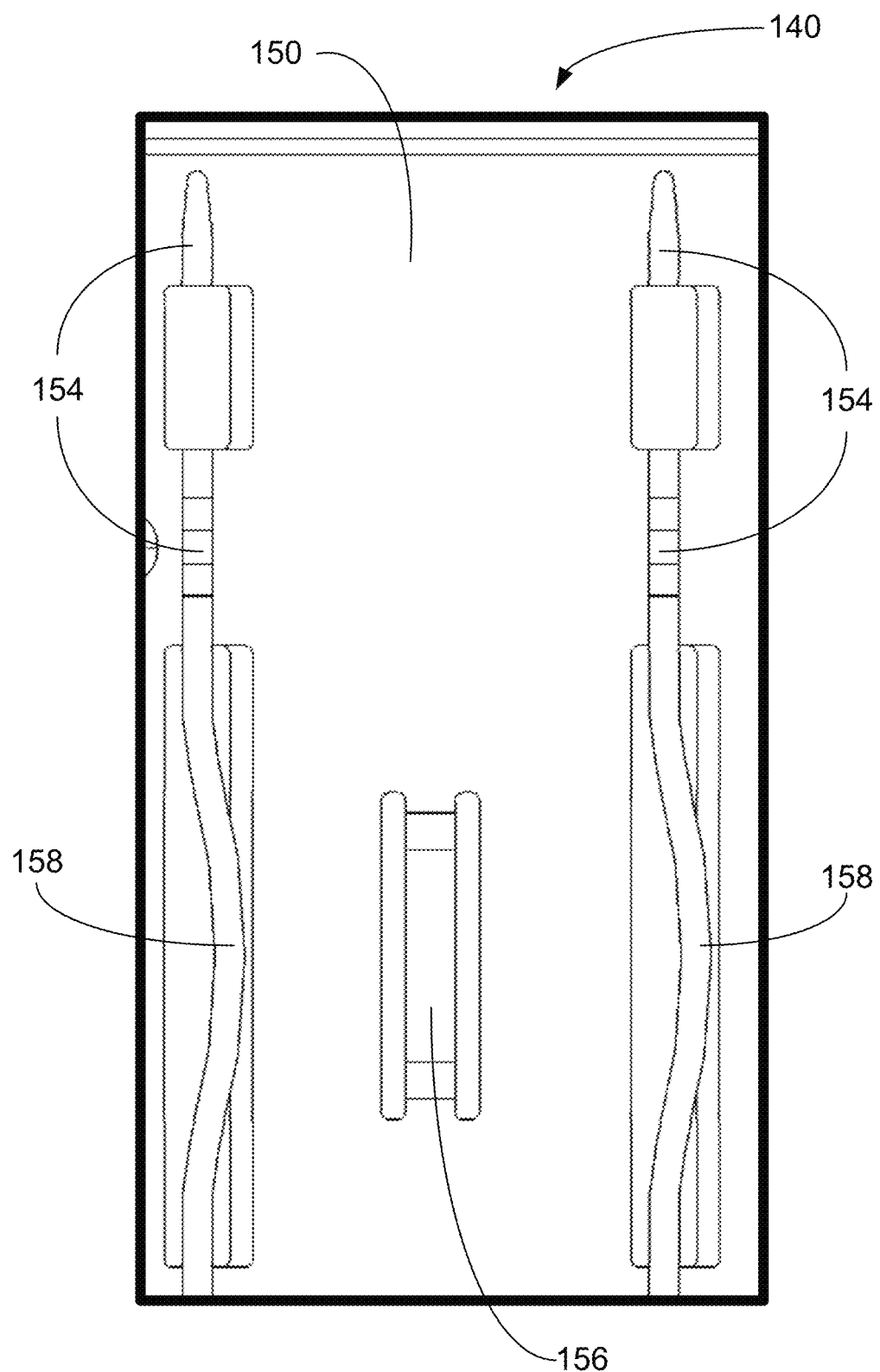

The first and second drive walls 120, 140 may include a variety of different features (e.g., alignment features) to define the individual drive slots 102 and assist in retaining the data storage devices 12. For example, as shown in FIGS. 5A and 5B, the second drive wall 140 (e.g., the interface portion 150 of the second drive wall 140) may include rails 154 configured to locate and guide the data storage devices 12 received by the drive slots 102. The rails 154 of the second drive wall 140 may help to define the independent drive slots 102 and ensure that the data storage devices 12 are properly positioned within the drive slots 102. Further, in one or more embodiments, the rails 154 may define a taper proximate a top of the second drive wall 140 to help guide each data storage device 12 into the corresponding drive slot 102 (e.g., by providing a larger distance between rails 154 proximate the top of the second drive wall 140 than a bottom of the second drive wall 140 to ease the insertion of the data storage device 12 into the drive slot 102).

As shown in FIGS. 5A and 5B, the second drive wall 140 (e.g., the interface portion 150 of the second drive wall 140) may include biasing members 156 (e.g., leaf springs) configured to apply a force to the data storage device 12 when located within the drive slot 102 (e.g., when the data storage devices 12 is restricted from movement by the first drive wall 120, second drive wall 140, and the plate 170). For example, the biasing member 156 may apply a force towards the opposing drive wall (e.g., the first or second drive wall 120, 140) to constrain the data storage device 12 between the first and second drive walls 120, 140. The biasing members 156 may also assist in dampening or minimizing the vibrations or movement of the data storage device 12. The biasing members 156 may be defined by a portion of the second drive wall 140 (e.g., defined by slits in the second drive wall 140) and protrude from the plane of the second drive wall 140. Further, in one or more embodiments, the biasing members 156 may be positioned at a centerpoint between the rails 154.

Additionally, as shown in FIGS. 5A and 5B, the second drive wall 140 (e.g., the interface portion 150 of the second drive wall 140) may include lateral biasing members 158 positioned along the rails 154 and deflecting away from an axis defined by the rails 154. The lateral biasing members 158 may apply a force against the data storage device 12 received by the drive slot 102 to help dampen or minimize the vibrations or movement of the data storage device 12. Specifically, the lateral biasing members 158 may include a deflectable portion that may apply a force on the data storage device 12 towards an adjacent drive slot 102 (e.g., in a direction along the row of drive slots 102). Furthermore, the first drive wall 120 (e.g., the interface portion 130) may include the same alignment features as described with regards to the second drive wall 140 (e.g., rails, biasing members, lateral biasing members, etc.).

Figure 6A:
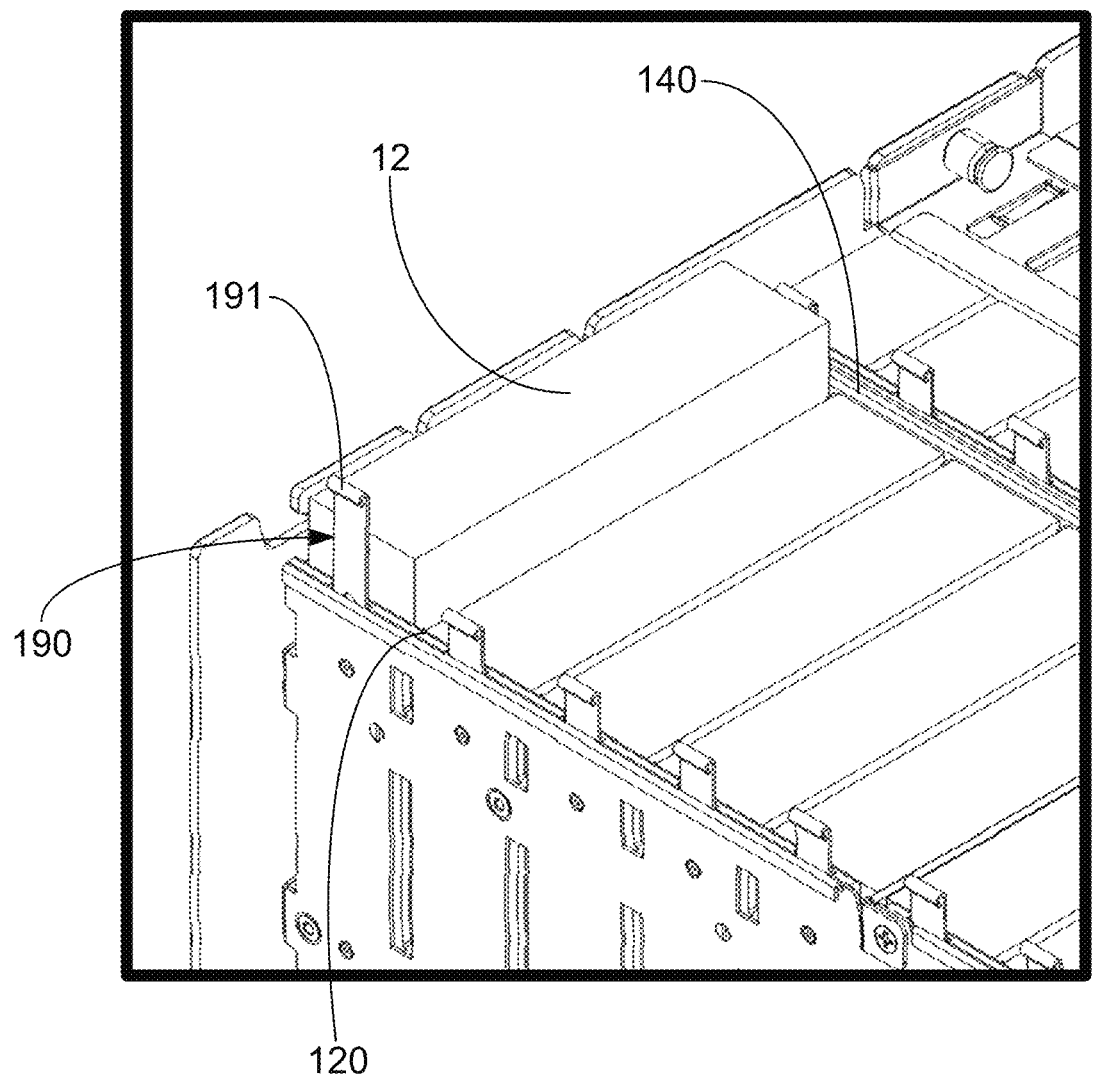
FIG. 6A is a perspective view of the storage chassis of FIG. 2 including an ejector in an engaged position.

In one or more embodiments, the storage chassis 100 may include a plurality of ejectors 190 (e.g., removal apparatus) configured to assist in removing the data storage devices 12 located in the drive slots 102 as shown in FIG. 6A. For example, each ejector 190 of the plurality of ejectors 190 may be associated with a drive slot 102 such that the ejector 190 may be actuated (e.g. by a user) independently to lift the data storage device 12 (e.g., away from the connector 104 or bottom portion 112 of the base 110) to simplify the removal process of that specific data storage device 12. Further, the ejector 190 may be actuated by a user without the use of any additional tools or components. However, the plate 170 must not be restricting movement of the data storage devices 12 for the ejector 190 to be able to move the data storage devices 12. Further, while the plate 170 restricts movement for the entire row of data storage devices 12, the ejectors 190 actuate or move the data storage devices 190 independently from one another.

Figure 6B:
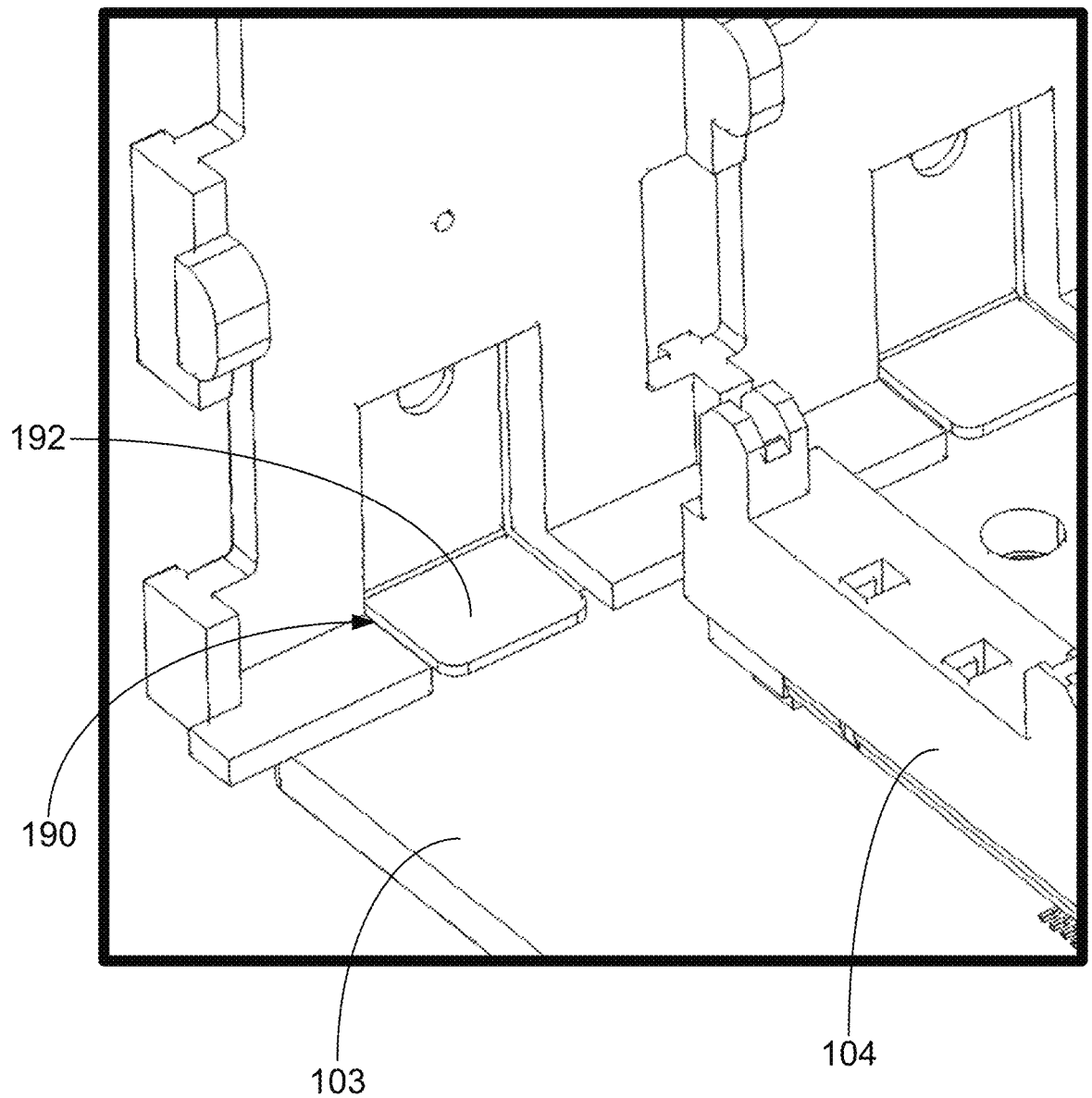
FIG. 6B is an expanded view of an ejector tab of the ejector of FIG. 6A in a disengaged position.
Figure 6C:
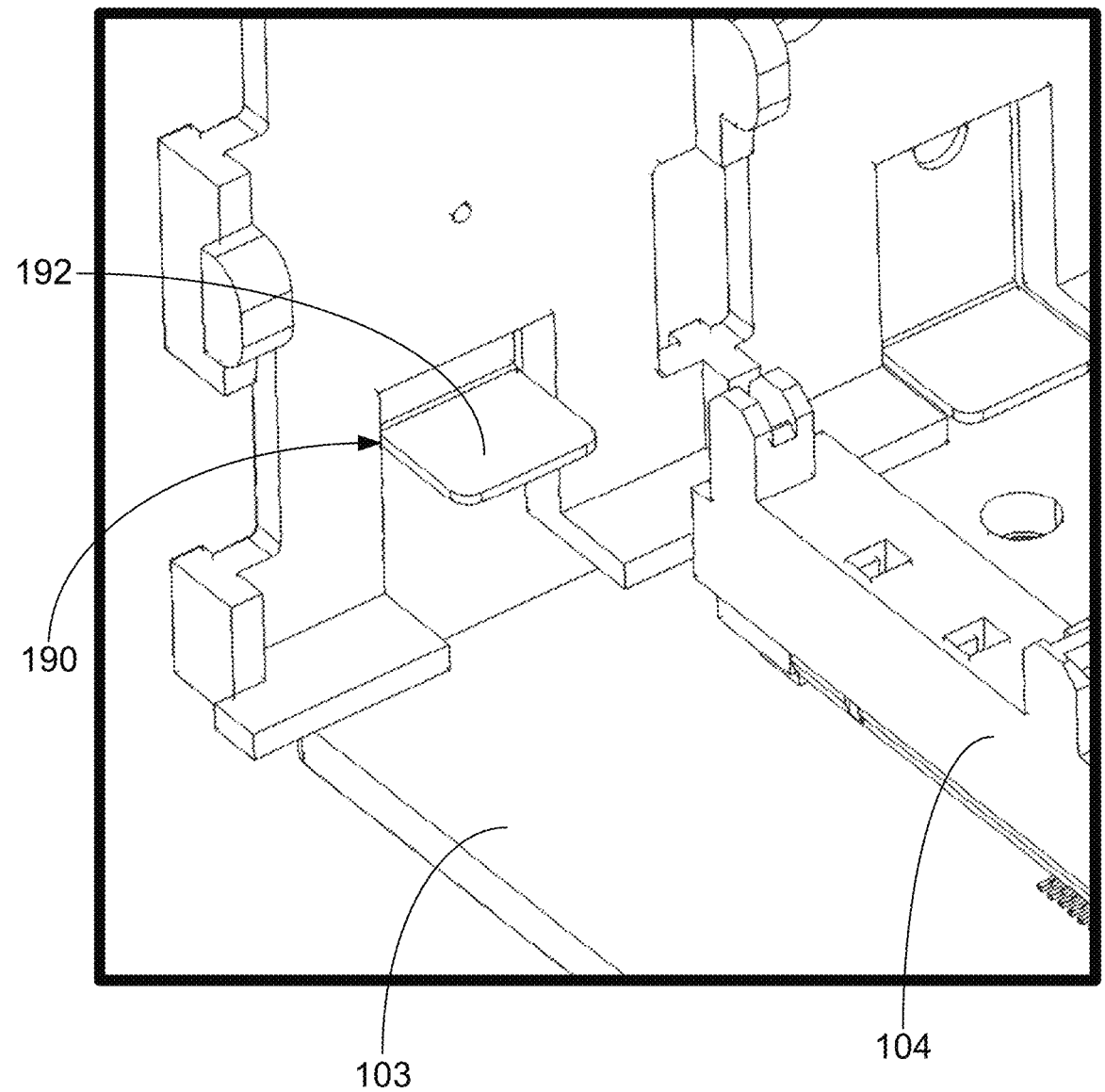
FIG. 6C is an expanded view of the ejector tab of FIG. 6B in the engaged position.

The ejectors 190 may be positioned proximate one of the first and second drive walls 120, 140. The ejectors 190 may include a handle 191 that extends away the first or second drive wall 120, 140 and may be configured to be grasped by a user to actuate the ejector 190. One of the ejectors 190 illustrated in FIG. 6A is actuated (e.g., in an engaged position) such that the data storage device 12 is lifted away from bottom portion 112 of the base 110. As shown in FIGS. 6B and 6C, the ejector 190 may include an ejector tab 192 to be positioned below the data storage device 12. The ejector tab 192 may physically contact the data storage device 12 to translate movement of the ejector 190 to the data storage device 12. The ejector 190 is configured in a disengaged position in FIG. 6B (e.g., adjacent the printed circuit board 103) so that the data storage device 12 may be operably coupled to the connector 104. As shown in FIG. 6C, the ejector tab 192 is spaced away from the printed circuit board 103 (e.g., as a result of actuating or lifting the ejector 190) to move the data storage device 12 away from the connector 104 and the printed circuit board 103 so that the data storage device 12 may be more easily removed from the drive slot 102. The ejector 190 may move a distance that is sufficient to disengage the data storage device 12 from the connector 104 and provide a user access to remove the data storage device 12.

Figure 8C:
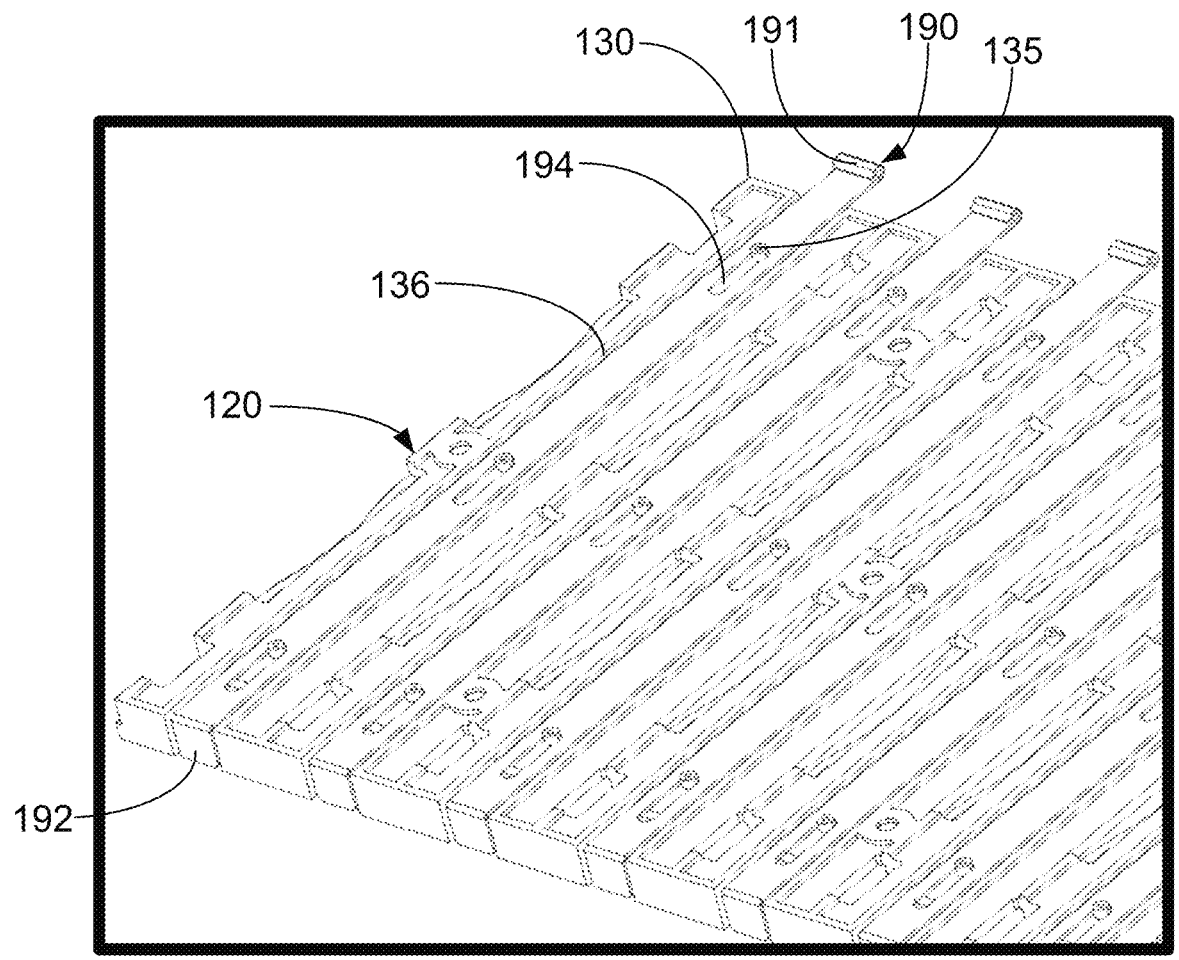
FIG. 8C is a perspective view of a portion of the first drive wall of FIG. 8A illustrating an ejector movably coupled to the portion of the first drive wall.

As shown in FIGS. 8B and 8C, the ejectors 190 may be located within the first drive wall 120. Specifically, the ejectors 190 may be positioned between the interface portion 130 and the outer portion 132 of the first drive wall 120. Further, the ejectors 190 may move relative to the first drive wall 120 in any suitable way. For example, as shown in FIG. 8C, the ejectors 190 may define a slot 194 that is configured to receive a protrusion 135 of the first drive wall 120 (e.g., of the interface portion 130). The protrusion 135 of the first drive wall 120 may help to locate and guide the ejector 190 (e.g., through the slot 194) as the ejector 190 moves relative to the first drive wall 120. Further, the interaction between the protrusion 135 of the first drive wall 120 and the slot 194 of the ejector 190 limits the travel distance of the ejector 190 relative to the first drive wall 120 (e.g., by contacting ends of the slot 194). In one or more embodiments, the first drive wall 120 (e.g., the interface portion 130) may define a groove 136 that receives the ejector 190 to, e.g., guide the ejector 190 within the first drive wall 120 and prevent the ejector from interfering with the outer portion 132 of the first drive wall 120. In some embodiments, the ejector 190 may define one or more slots 194 to receive one or more corresponding protrusions 135 of the first drive wall 120 to provide further robustness and redundancy to the relative motion between the ejector 190 and the first drive wall 120.

Figure 10:
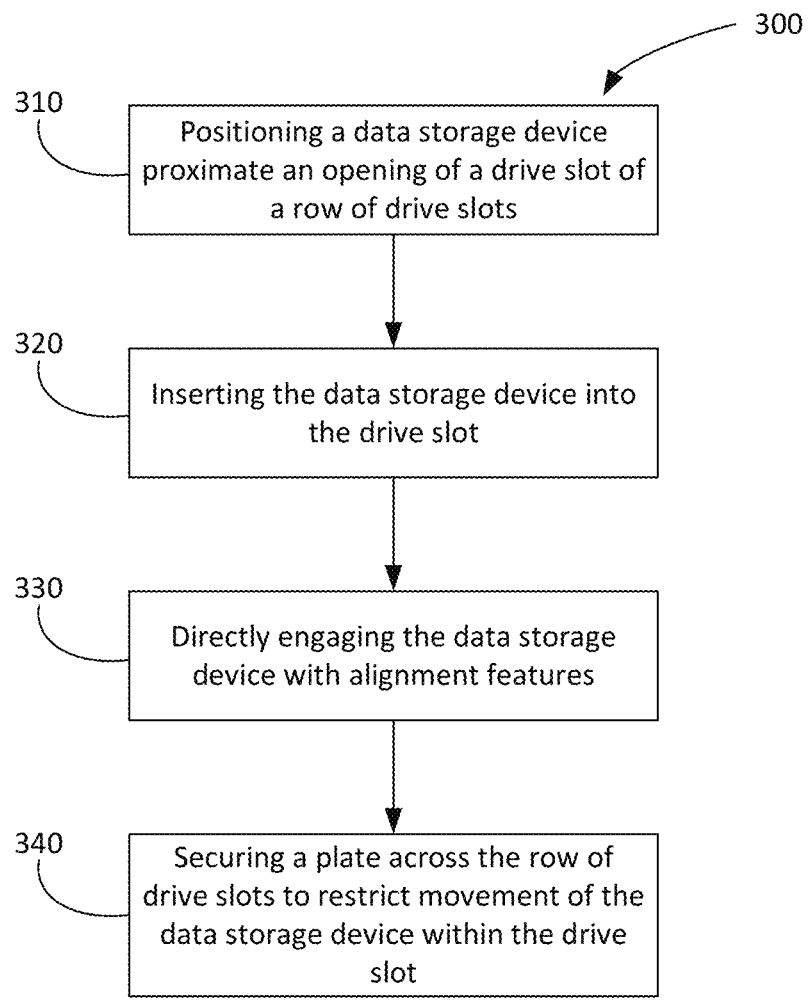
FIG. 10 is a block diagram of an illustrative method of interfacing a data storage device with a storage chassis according to the illustrative embodiments shown in FIGS. 1-9.

A method 300 of interfacing a data storage device with a storage chassis is illustrated in FIG. 10. The method 300 may include positioning 310 a data storage device proximate an opening of a drive slot of a row of drive slots defined by a base, a first drive wall, and a second drive wall spaced apart from the first drive wall (e.g., as further described herein with regards to storage chassis 100). The method may also include inserting 320 (e.g., installing) the data storage device into the drive slot. Further, the method may include directly engaging 330 the data storage device with alignment features (e.g., rails, biasing members, lateral biasing members, etc.) of the first and second drive walls and a board connector of the base. In one or more embodiments, directly engaging 330 may include direct contact between the data storage device and the first and second drive walls (e.g., without any intervening carrier or components). Also, the method may include securing 340 a plate across the row of drive slots to restrict movement of the data storage device within the drive slot (e.g., using a latching member 174 or clasp), e.g., by applying a downward force on the data storage device to restrict the data storage device between the first drive wall, the second drive wall, the base, and the plate. In one or more embodiments, the method may also include inserting additional data storage devices into other drive slots of the row of drive slots or additional rows of drive slots as described herein.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise. As used herein, "or" is generally employed in its sense including "and/or" unless the content clearly dictates otherwise. As used herein, "have," "having," "include," "including," "comprise," "comprising," or the like are used in their open-ended sense, and generally mean "including, but not limited to."

Embodiments of the systems, storage chassis, and methods associated therewith are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An apparatus comprising:
   a base;
   a first drive wall coupled to and extending from the base;
   a second drive wall coupled to and extending from the base, the first drive wall spaced apart from the second drive wall, and the base, the first drive wall, and the second drive wall defining a row of drive slots, each drive slot of the row of drive slots configured to receive a carrierless data storage device;
   a plate extending across the row of drive slots and configured to extend over the carrierless data storage devices received by the row of drive slots;
   an additional first drive wall coupled to and extending from the base;
   an additional second drive wall coupled to and extending from the base, the additional first drive wall coextending along the second drive wall and the additional second drive wall is spaced apart from the additional first drive wall such that the additional first drive wall is between the second drive wall and the additional second drive wall, the base, the additional first drive wall, and the additional second drive wall defining an additional row of drive slots, each drive slot of the additional row of drive slots configured to receive the carrierless data storage device; and
   an additional plate extending across the additional row of drive slots and configured to extend over the carrierless data storage devices when received by the additional row of drive slots.

2. The apparatus of claim 1, wherein the plate is removably couplable to the base.

3. The apparatus of claim 1, wherein the base comprises a bottom portion and two sidewall portions extending from opposing ends of the bottom portion, wherein each of the first and second drive walls is coupled to the bottom portion and the two sidewall portions.

4. The apparatus of claim 1, wherein each of the first and second drive walls comprises an interface portion and an outer portion, wherein the interface portion of each of the first and second drive walls directly interfaces with the carrierless data storage device received by the drive slot.

5. The apparatus of claim 4, wherein the interface portion comprises rails configured to locate and guide the carrierless data storage device received by the drive slot.

6. The apparatus of claim 4, wherein the interface portion comprises biasing members configured to apply a force to the carrierless data storage device, when received by the drive slot, to retain the carrierless data storage device within the drive slot.

7. The apparatus of claim 1, further comprising an ejector proximate one of the first and second drive walls, wherein the ejector is actuatable to move the carrierless data storage device received by the drive slot away from the base.

8. The apparatus of claim 1, wherein the carrierless data storage device directly contacts the first and second drive walls when received within the drive slot.

9. A system comprising:
   a storage chassis comprising:
      a base comprising a plurality of board connectors,
      a first drive wall coupled to and extending from the base,
      a second drive wall coupled to and extending from the base, the first drive wall spaced apart from the second drive wall, and the base, the first drive wall, and the second drive wall defining a row of drive slots, and
      a plate removably coupled to the base and extending across the row of drive slots;
   a carrierless data storage device positioned within a drive slot of the row of drive slots and operably coupled to a board connector of the plurality of board connectors, the carrierless data storage device restricted from movement by the first drive wall and the second drive wall;

an additional first drive wall coupled to and extending from the base;

an additional second drive wall coupled to and extending from the base, the additional first drive wall coextending along and in contact with at least a portion of the second drive wall, the additional second drive wall is spaced apart from the additional first drive wall such that the additional first drive wall is between the second drive wall and the additional second drive wall; the base, the additional first drive wall, and the additional second drive wall defining an additional row of drive slots.

10. The system of claim 9, wherein the base comprises a bottom portion and two sidewall portions extending from opposing ends of the bottom portion, wherein each of the first and second drive walls is coupled to the bottom portion and the two sidewall portions.

11. The system of claim 9, wherein the plate comprises a biasing member configured to apply a force against the carrierless data storage device when the plate is coupled to the base.

12. The system of claim 9, wherein the plate comprises a latching member to removably couple the plate and the base.

13. The system of claim 9, further comprising:
an additional plate removably coupled to the base and extending across the additional row of drive slots, wherein an additional carrierless data storage device is positioned within a drive slot of the additional row of drive slots and the additional carrierless data storage device is restricted from movement by the additional first drive wall, the additional second drive wall, and the additional plate.

14. The system of claim 9, wherein the carrierless data storage device directly contacts the first drive wall, the second drive wall, and the plate to restrict movement of the carrierless data storage device.

15. A method comprising:
positioning a data storage device proximate an opening of a drive slot of a row of drive slots defined by a base, a first drive wall, and a second drive wall spaced apart from the first drive wall;
inserting the data storage device into the drive slot;
directly engaging the data storage device with alignment features of the first and second drive walls and a board connector of the base;
securing a plate across the row of drive slots to restrict movement of the data storage device within the drive slot;
positioning an additional data storage device proximate an opening of a drive slot of an additional row of drive slots extending alongside the row of drive slots;
inserting the additional data storage device into the drive slot of the additional row of drive slots; and
securing an additional plate across the additional row of drive slots to restrict movement of the additional data storage device.

16. A storage chassis comprising:
a base comprising a bottom portion extending between a first end and a second end, the base further comprising a first sidewall portion extending from the first end of the bottom portion and a second sidewall portion extending from the second end of the bottom portion;
a first drive wall coupled to the bottom portion of the base and extending between a first end and a second end, the first end of the first drive wall coupled to the first sidewall portion and the second end of the first drive wall coupled to the second sidewall portion;
a second drive wall coupled to the bottom portion of the base and extending between a first end and a second end, the first end of the second drive wall coupled to the first sidewall portion and the second end of the second drive wall coupled to the second sidewall portion, the second drive wall spaced apart from and extending parallel to the first drive wall, a row of drive slots defined by the base, the first drive wall, and the second drive wall, each drive slot of the row of drive slots configured to receive a data storage device, an additional row of drive slots positioned adjacent to and extending alongside the row of drive slots, each drive slot of the additional row of drive slots configured to receive the data storage device;
a plate removably coupled to the first and second sidewall portions of the base and extending across the row of drive slots between a first end and a second end;
an additional plate extending across the additional row of drive slots and configured to extend over the additional data storage device when received by the drive slot; and
a plurality of ejectors proximate one of the first and second drive walls, each ejector of the plurality of ejectors is associated with a drive slot of the row of drive slots and is actuatable to move the data storage device received by the drive slot away from the bottom portion of the base.

17. The storage chassis of claim 16, further comprising:
an additional first drive wall coupled to and extending from the base; and
an additional second drive wall coupled to and extending from the base, wherein the additional first drive wall coextends along the second drive wall and the additional second drive wall is spaced apart from the additional first drive wall such that the additional first drive wall is between the second drive wall and the additional second drive wall, wherein the base, the additional first drive wall, and the additional second drive wall define the additional row of drive slots.

18. The storage chassis of claim 16, wherein the data storage device directly contacts the first and second drive walls when received within the drive slot.

19. The storage chassis of claim 16, wherein each of the first and second drive walls comprises an interface portion and an outer portion, wherein the interface portion of each of the first and second drive walls directly interfaces with the data storage device received by the drive slot.

\* \* \* \* \*